US008486842B2

United States Patent
Hsu et al.

(10) Patent No.: US 8,486,842 B2
(45) Date of Patent: Jul. 16, 2013

(54) METHOD OF SELECTIVELY REMOVING PATTERNED HARD MASK

(75) Inventors: Che-Hua Hsu, Hsinchu County (TW); Shao-Hua Hsu, Taoyuan County (TW); Zhi-Cheng Lee, Tainan (TW); Cheng-Guo Chen, Changhua County (TW)

(73) Assignee: United Microelectronics Corp., Hsinchu (TW)

( * ) Notice: Subject to any disclaimer, the term of this patent is extended or adjusted under 35 U.S.C. 154(b) by 347 days.

(21) Appl. No.: 12/901,453

(22) Filed: Oct. 8, 2010

(65) Prior Publication Data
US 2012/0088368 A1    Apr. 12, 2012

(51) Int. Cl.
*H01L 21/302* (2006.01)

(52) U.S. Cl.
USPC .................... 438/717; 438/689; 438/706

(58) Field of Classification Search
None
See application file for complete search history.

(56) References Cited

U.S. PATENT DOCUMENTS

| 2007/0096183 A1* | 5/2007 | Ogawa et al. | 257/300 |
| 2010/0019344 A1* | 1/2010 | Chuang et al. | 257/516 |
| 2011/0117710 A1* | 5/2011 | Lin et al. | 438/238 |

* cited by examiner

Primary Examiner — Lan Vinh
Assistant Examiner — Jiong-Ping Lu
(74) Attorney, Agent, or Firm — WPAT, PC; Justin King

(57) ABSTRACT

A method of selectively removing a patterned hard mask is described. A substrate with a patterned target layer thereon is provided, wherein the patterned target layer includes a first target pattern and at least one second target pattern, and the patterned hard mask includes a first mask pattern on the first target pattern and a second mask pattern on the at least one second target pattern. A first photoresist layer is formed covering the first mask pattern. The sidewall of the at least one second target pattern is covered by a second photoresist layer. The second mask pattern is removed using the first photoresist layer and the second photoresist layer as a mask.

16 Claims, 2 Drawing Sheets

METHOD OF SELECTIVELY REMOVING PATTERNED HARD MASK

BACKGROUND OF THE INVENTION

1. Field of Invention

This invention relates to integrated circuit (IC) fabrication, and more particularly relates to a method of selectively removing a patterned hard mask.

2. Description of Related Art

Hard mask is usually used in patterning processes in IC fabrication for higher resistance to dry etching. After the target layer is patterned with a patterned hard mask, the hard mask may be retained, entirely removed or selectively removed, as required by later steps. For example, in manufactures of certain products, after a poly-Si layer is defined into gate electrodes of MOS transistors and resistors and spacers are formed on their sidewalls, the mask patterns on the gate electrodes will be retained and those on the resistors will be removed for salicide formation. In such case, conventionally, only the mask patterns on the gate electrodes are covered by photoresist before the removal.

However, during the etching of the mask patterns on the resistors, the spacer on the sidewall of each resistor is also damaged much so that the salicide is formed thicker than required at the top edge of each resistor.

SUMMARY OF THE INVENTION

Accordingly, this invention provides a method of selectively removing a patterned hard mask.

The method is described as follows. A substrate with a patterned target layer thereon is provided, wherein the patterned target layer includes a first target pattern and at least one second target pattern, and the patterned hard mask includes a first mask pattern on the first target pattern and a second mask pattern on the at least one second target pattern. A first photoresist layer is formed covering the first mask pattern. The sidewall of the at least one second target pattern is covered by a second photoresist layer. The second mask pattern is removed using the two photoresist layers as a mask.

In an embodiment, each of the first target pattern and the at least one second target pattern is disposed with a spacer structure on its sidewall. The spacer structure may include a first spacer and a second spacer disposed on the first spacer, and may further include an L-shaped liner layer partially between the first or second target pattern and the first spacer and partially under the first spacer.

In an embodiment, covering the sidewall of the at least one second target pattern by the second photoresist layer includes the steps below. A blanket photoresist layer is formed covering the first photoresist layer and the second mask pattern. A thickness of the blanket photoresist layer is removed, possibly with a partial dry etching-back step, to expose the second mask pattern, wherein the remaining blanket photoresist layer covers the sidewall of the at least one second target pattern and is the second photoresist layer.

In an embodiment, the first target pattern includes a gate electrode of a MOS transistor and the at least one second target pattern includes at least one resistor and an electric fuse. The gate electrode, the at least one resistor and the electric fuse may include doped polysilicon. The at least one resistor may include a first resistor to be partially covered by a salicide layer, and a second resistor to be entirely covered by the salicide layer. It is possible that each of the gate electrode, the at least one resistor and the electric fuse is disposed over a high-K dielectric layer.

In an embodiment where the target layer includes poly-Si, each of the first and second target patterns has a spacer structure on its sidewall and salicide is to be formed on the second target pattern, because the spacer structure on the sidewall of each second target pattern is protected by the second photoresist layer and thereby damaged much less during the etching of the exposed mask patterns, salicide will not be formed thicker than required on the top edge of each second target pattern.

In order to make the aforementioned and other objects, features and advantages of the present invention comprehensible, a preferred embodiment accompanied with figures is described in detail below.

DESCRIPTION OF EMBODIMENTS

FIGS. 1A-1D illustrate a method of selectively removing a patterned hard mask according to an embodiment of this invention in a cross-sectional view.

Figure 1A:
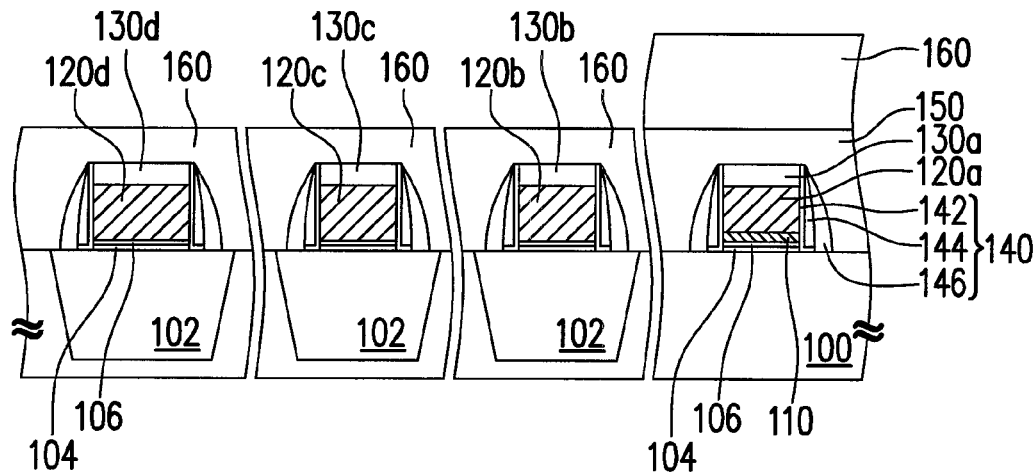
FIGS. 1A-1D illustrate a method of selectively removing a patterned hard mask according to an embodiment of this invention in a cross-sectional view.

Referring to FIG. 1A, a substrate 100 is provided, having thereon an isolation structure 102, a dielectric liner 104, a high-K dielectric layer 106 on the dielectric liner 104, a barrier metal layer 110 on the high K dielectric layer 106, a gate electrode 120a of a MOS transistor, an electric fuse (e-fuse) 120b, a first resistor 120c, a second resistor 120d, hard mask patterns 130a-130d for defining 120a-120d, and multiple spacer structures 140.

The gate electrode 120a, the e-fuse 120b, the first resistor 120c and the second resistor 120d are defined from the, same (semi-)conductive layer, such as a doped poly-Si layer. The e-fuse 120b, the first resistor 120c and the second resistor 120d are disposed on the isolation structure 102, which may be a shallow trench isolation (STI) structure. The first resistor 120c is to be entirely covered by salicide, and the second resistor 120d is to be partially covered by salicide, as described later. The linewidth of the second resistor 120d is larger than that of the first resistor 120c.

The stacked structure of the dielectric liner 104 and the high-K layer 106 is patterned following the patterning of 120a-120d, wherein the high-K layer 106 under the gate electrode 120a serve as a gate dielectric layer. The barrier metal layer 110 is disposed in the gate electrode 120a to block diffusion of metal atoms and protect high-K layer from ambient process effect. The gate electrode 120a, the e-fuse 120b, the first resistor 120c and the second resistor 120d are under corresponding hard mask patterns 130a, 130b, 130c and 130d, respectively. The hard mask patterns 130a, 130b, 130c and 130d together constitute a patterned hard mask as mentioned above.

The dielectric liner 104 may include $SiO_2$, and may have a thickness of about 3-20 angstroms. The high-K layer 106 may include Hf-based dielectric, such as $HfO_2$, HfZrO or HfSrO, etc., and may have a thickness of about 10-50 angstroms. The barrier metal layer 110 may include TiN or TaN, and may have a thickness of about 10-150 angstroms. The gate electrode 120a, the e-fuse 120b, the first resistor 120c and second resistor 120d may have a thickness of 200-800 angstroms. The hard mask patterns 130a-130d may include silicon nitride (SiN) or silicon oxynitride (SiON), and may have a thickness of about 100-500 angstroms.

Each of the gate electrode 120a, the e-fuse 120b, the first resistor 120c and the second resistor 120d has a spacer structure 140 on its sidewall. Each spacer structure 140 may include an L-shaped liner layer 142, a first spacer 144 and a second spacer 146 disposed on the first spacer 144, where the L-shaped liner layer 142 is partially between 120a/b/c/d and the first spacer 144 and partially under the first spacer 144. Such a double-spacer structure 140 may result from a source/drain (S/D) formation process of CMOS transistors, wherein the precursor layer of the first spacer 144 serves as a second spacer stopping layer in the spacer etching process and the second spacer 146 as a mask in the S/D implantation step of NMOS. It is noted that each of the NMOS transistors and the PMOS transistors can be represented by the gate structure illustrated in FIG. 1A.

The L-shaped liner layers 142 may include SiN and may have a thickness of 15-40 angstroms. The first spacers 144 may include $SiO_2$. The second spacers 146 may include SiN or SiON.

Referring to FIG. 1A again, a first photoresist layer 150 is then formed covering the hard mask pattern 130a on the gate electrode 120a and the spacer structure 140 on the sidewall of the gate electrode 120a. The first photoresist layer 150 may be formed in a known manner, generally with an exposure step using a photomask and subsequent development and curing steps, and may include a positive- or negative-type photoresist material. Thereafter, a blanket (second) positive-type photoresist layer 160 is formed entirely covering the above resulting structure.

Figure 1B:
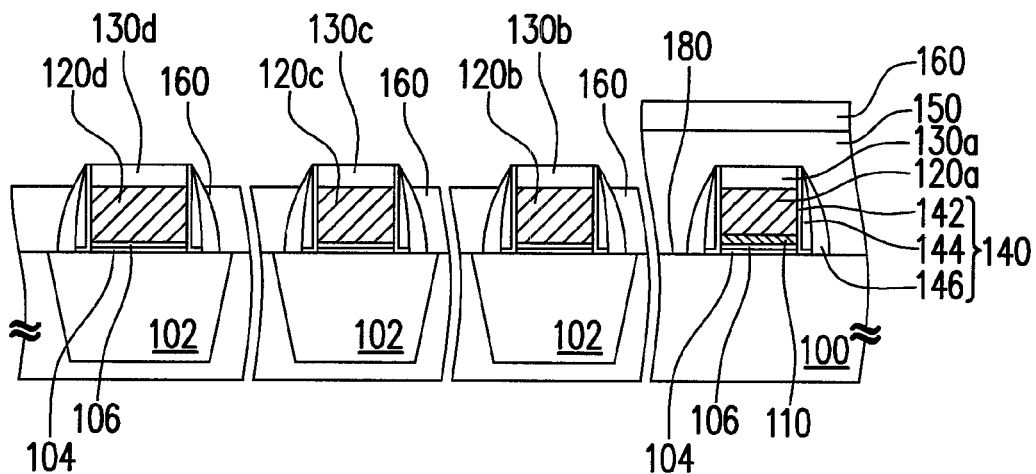

Referring to FIG. 1B, a thickness of the second photoresist layer 160 is removed to expose the hard mask patterns 130b, 130c and 130d respectively on the e-fuse 120b, the first resistor 120c and the second resistor 120d that are to be formed with silicide thereon, wherein the remaining second photoresist layer 160 covers the sidewall of each of the e-fuse 120b, the first resistor 120c and the second resistor 120d. The removal of the thickness of the second photoresist layer 160 may include a partial dry etching-back step. The value of the removed thickness is positively proportional to the etching time.

Figure 1C:
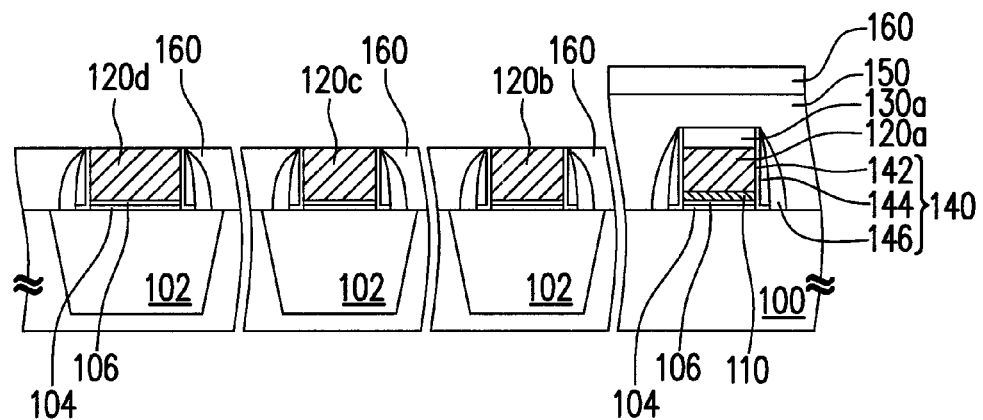

Referring to FIG. 1C, the exposed hard mask patterns 130b, 130c and 130d respectively on the e-fuse 120b, the first resistor 120c and the second resistor 120d are removed through dry etching, using the first photoresist layer 150 and the remaining second photoresist layer 160 as a mask. Although the exposed spacer structures 140 each including a L-shaped liner layer 142, a first spacer 144 and a second spacer 146 is also partially removed during the dry etch, it is damaged much less as compared to the prior art due to the protection of the remaining second photoresist layer 160.

Figure 1D:
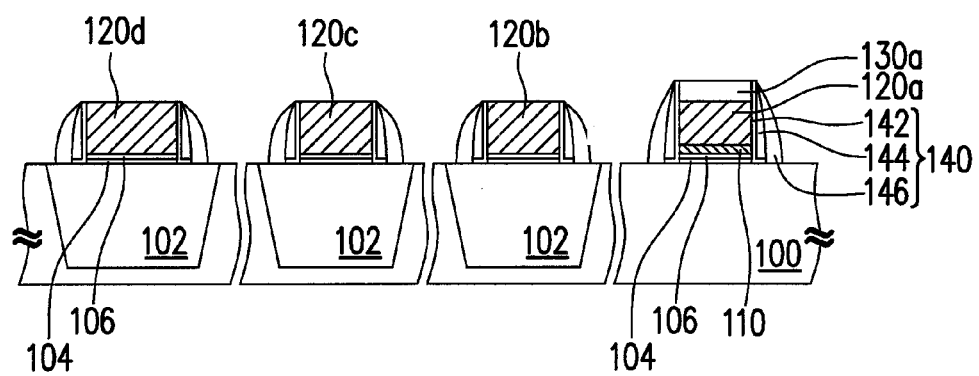

Referring to FIG. 1D, the first photoresist layer 150 and the second photoresist layer 160 are removed, possibly through $O_2$ stripping and polymer cleaning. Thus, the process of partially removing a patterned hard mask according to this embodiment is finished.

Figure 2:
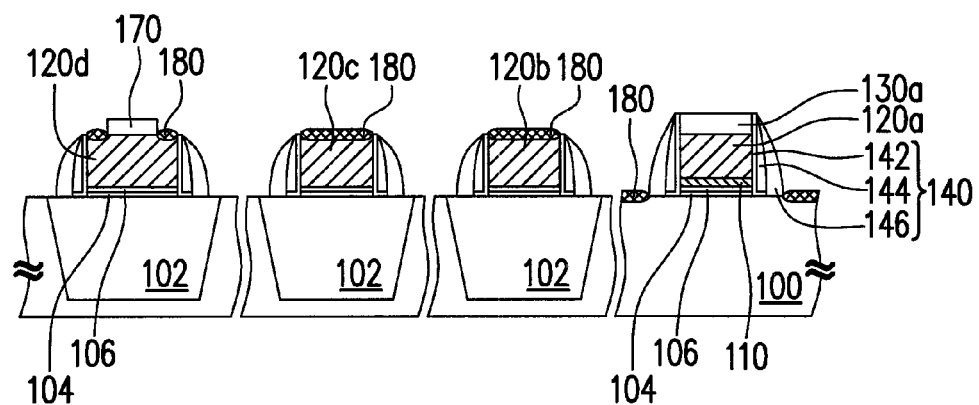
FIG. 2 illustrates a possible step after the patterned hard mask is selectively removed according to the embodiment of this invention.

After that, as shown in FIG. 2, a salicide blocking (SAB) layer 170 and a salicide layer 180 may be formed in sequence. The SAB layer 170 covers merely a portion of the second resistor 120d, so the second resistor 120d is partially covered by the salicide layer 180, wherein the portion of the salicide layer 180 on the second resistor 120d acts as an ohmic contact of the same. On the other hand, the SAB layer 170 is not formed on the e-fuse 120b and the first resistor 120c, so the two are both entirely covered by the salicide layer 180. The first resistor 120c entirely covered by the salicide layer 180 has a resistance much lower than that of the second resistor 120d partially covered by the salicide layer 180, and the first resistor 120c and the second resistor 120d are designed for different purposes.

Since the exposed spacer structures 140 are damaged much less as compared to the prior art due to the protection of the adjacent second photoresist layer 160 (FIG. 1C), the salicide layer 180 is not formed thicker than required at the top edge of the e-fuse 120b, the first resistor 120c or the second resistor 120d. Thus, the electrical properties of the product can be controlled more easily.

It is noted that though each spacer structure is a composite structure, most of the patterns of the target layer is disposed on multiple thin films of some specific functions and the patterned hard mask is selectively removed for selective salicide formation in the above embodiment, this invention is not limited thereto. For example, the spacer structure on the sidewall of each target pattern may alternatively include a single spacer or more than two spacers in this invention. Or, each target pattern may alternatively be formed directly on the substrate, or on one or more thin films of different function(s) on the substrate. In addition, the purpose of selectively removing the patterned hard mask may alternatively be selective removal of the material of the target layer.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of selectively removing a patterned hard mask, comprising:
   providing a substrate with a patterned target layer thereon, wherein the patterned target layer includes a first target pattern and at least one second target pattern, and the patterned hard mask includes a first mask pattern on the first target pattern and a second mask pattern on the at least one second target pattern;
   forming a first photoresist layer covering the first mask pattern;
   forming a blanket photoresist layer covering the first photoresist layer and the second mask pattern;
   removing a thickness of the blanket photoresist layer to expose the second mask pattern, and remaining a portion of the blanket photoresist layer to cover a sidewall of the at least one second target pattern; and
   removing the second mask pattern using the first photoresist layer and the remaining blanket photoresist layer as a mask.

2. The method of claim 1, wherein each of the first target pattern and the at least one second target pattern is disposed with a spacer structure on its sidewall.

3. The method of claim 2, wherein the spacer structure comprises a first spacer and a second spacer disposed on the first spacer.

4. The method of claim 3, wherein the spacer structure further comprises an L-shaped liner layer partially between the first or second target pattern and the first spacer and partially under the first spacer.

5. The method of claim 1, wherein the step of removing the thickness of the blanket photoresist layer comprises a partial dry etching-back step.

6. The method of claim 1, wherein the first target pattern comprises a gate electrode of a MOS transistor, and the at least one second target pattern comprises at least one resistor and an electric fuse.

7. The method of claim 6, wherein the gate electrode, the at least one resistor and the electric fuse comprise doped polysilicon.

8. The method of claim 7, wherein the at least one resistor comprises a first resistor to be partially covered by a salicide layer, and a second resistor to be entirely covered by the salicide layer.

9. The method of claim 6, wherein each of the gate electrode, the at least one resistor and the electric fuse is disposed over a high-K dielectric layer.

10. A method of selectively removing a patterned hard mask, comprising:
 providing a substrate having thereon a patterned poly-Si layer that includes a first poly-Si pattern and at least one second poly-Si pattern, wherein the patterned hard mask includes a first mask pattern on the first poly-Si pattern and a second mask pattern on the at least one second poly-Si pattern, and each of the first poly-Si pattern and the at least one second poly-Si pattern has a spacer structure on its sidewall;
 forming a first photoresist layer covering the first mask pattern and the spacer structure on the sidewall of the first poly-Si pattern;
 forming a second photoresist layer covering the first photoresist layer, the second mask pattern and the spacer structure on the sidewall of the at least one second poly-Si pattern; and
 removing a thickness of the second photoresist layer to expose the second mask pattern, wherein the remaining second photoresist layer covers the sidewall of the at least one second poly-Si pattern; and
 removing the second mask pattern using the first photoresist layer and the second photoresist layer as a mask.

11. The method of claim 10, wherein the step of removing the thickness of the second photoresist layer comprises a partial dry etching-back step.

12. The method of claim 10, wherein the spacer structure comprises a first spacer and a second spacer disposed on the first spacer.

13. The method of claim 12, wherein the spacer structure further comprises an L-shaped liner layer partially between the first or second poly-Si pattern and the first spacer and partially under the first spacer.

14. The method of claim 10, wherein the first poly-Si pattern comprises a gate electrode of a MOS transistor and the at least one second poly-Si pattern comprises at least one resistor and an electric fuse.

15. The method of claim 14, wherein the at least one resistor comprises a first resistor to be partially covered by a salicide layer, and a second resistor to be entirely covered by the salicide layer.

16. The method of claim 14, wherein each of the gate electrode, the at least one resistor and the electric fuse is disposed over a high-K dielectric layer.

* * * * *